(12) United States Patent
Streets et al.

(10) Patent No.: US 10,345,617 B1
(45) Date of Patent: *Jul. 9, 2019

(54) WEARABLE ELECTRONIC DEVICE WITH ARTICULATED JOINT

(71) Applicant: Snap Inc., Venice, CA (US)

(72) Inventors: Nicholas Streets, Santa Monica, CA (US); Jun Lin, Culver City, CA (US); Stephen Steger, Santa Monica, CA (US)

(73) Assignee: Snap Inc., Santa Monica, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/654,441

(22) Filed: Jul. 19, 2017

Related U.S. Application Data

(63) Continuation of application No. 15/086,233, filed on Mar. 31, 2016, now Pat. No. 9,746,692.

(60) Provisional application No. 62/301,061, filed on Feb. 29, 2016.

(51) Int. Cl.
| | |
|---|---|
| *G02B 5/22* | (2006.01) |
| *G02C 5/22* | (2006.01) |
| *G02C 11/00* | (2006.01) |
| *G02C 5/14* | (2006.01) |

(52) U.S. Cl.
CPC .............. *G02C 5/22* (2013.01); *G02C 5/143* (2013.01); *G02C 11/10* (2013.01)

(58) Field of Classification Search
CPC ................. G02C 5/22; G02C 5/2209
USPC ................. 351/153, 158; 347/7–9
See application file for complete search history.

(56) References Cited

U.S. PATENT DOCUMENTS

| | | |
|---|---|---|
| 6,038,295 A | 3/2000 | Mattes |
| 6,980,909 B2 | 12/2005 | Root et al. |
| 7,173,651 B1 | 2/2007 | Knowles |
| 7,411,493 B2 | 8/2008 | Smith |
| (Continued) | | |

FOREIGN PATENT DOCUMENTS

| | | |
|---|---|---|
| CA | 2887596 A1 | 7/2015 |
| CN | 108885358 | 11/2018 |
| (Continued) | | |

OTHER PUBLICATIONS

"U.S. Appl. No. 15/073,856, Non Final Office Action dated Mar. 9, 2017", 7 pgs.

(Continued)

*Primary Examiner* — Darryl J Collins
(74) *Attorney, Agent, or Firm* — Schwegman Lundberg & Woessner, P.A.

(57) ABSTRACT

Apparatuses, systems for electronic wearable devices such as smart glasses are described. The wearable device can comprise a frame, an elongate temple and an articulated joint. The frame can define one or more optical element holders configured to hold respective optical elements for viewing by a user in a viewing direction. The temple can be moveably connected to the frame for holding the frame in position when the device is worn by the user. The articulated joint can connect the temple and the frame to permit movement of the temple relative to the frame between a wearable position in which the temple is generally aligned with the viewing direction, and a collapsed position in which the temple extends generally transversely to the viewing direction. The articulated joint can include a base foot fixed to the frame and oriented transversely to the viewing direction.

20 Claims, 5 Drawing Sheets

(56) References Cited

U.S. PATENT DOCUMENTS

| | | | |
|---|---|---|---|
| 7,535,890 | B2 | 5/2009 | Rojas |
| 8,131,597 | B2 | 3/2012 | Hudetz et al. |
| 8,199,747 | B2 | 6/2012 | Rojas |
| 8,332,475 | B2 | 12/2012 | Rosen et al. |
| 8,718,333 | B2 | 5/2014 | Wolf et al. |
| 8,724,622 | B2 | 5/2014 | Rojas |
| 8,874,677 | B2 | 10/2014 | Rosen et al. |
| 8,909,679 | B2 | 12/2014 | Root et al. |
| 8,995,433 | B2 | 3/2015 | Rojas |
| 9,040,574 | B2 | 5/2015 | Wang et al. |
| 9,055,416 | B2 | 6/2015 | Rosen et al. |
| 9,100,806 | B2 | 8/2015 | Rosen et al. |
| 9,100,807 | B2 | 8/2015 | Rosen et al. |
| 9,191,776 | B2 | 11/2015 | Root et al. |
| 9,204,252 | B2 | 12/2015 | Root et al. |
| 9,443,227 | B2 | 9/2016 | Evans et al. |
| 9,482,882 | B1 | 11/2016 | Hanover et al. |
| 9,482,883 | B1 | 11/2016 | Meisenholder |
| 9,489,661 | B2 | 11/2016 | Evans et al. |
| 9,491,134 | B2 | 11/2016 | Rosen et al. |
| 9,746,692 | B1 | 8/2017 | Streets et al. |
| 9,851,585 | B2 | 12/2017 | Ashwood |
| 2008/0198324 | A1 | 8/2008 | Fuziak et al. |
| 2010/0309426 | A1 | 12/2010 | Howell et al. |
| 2011/0202598 | A1 | 8/2011 | Evans et al. |
| 2011/0221656 | A1 | 9/2011 | Haddick et al. |
| 2012/0155064 | A1 | 6/2012 | Waters |
| 2012/0209924 | A1 | 8/2012 | Evans et al. |
| 2014/0259271 | A1 | 9/2014 | Cox et al. |
| 2014/0368544 | A1 | 12/2014 | Kobayashi |
| 2016/0041395 | A1 | 2/2016 | Yajima |
| 2016/0212888 | A1 | 7/2016 | Nikkhoo et al. |
| 2016/0252727 | A1 | 9/2016 | Mack et al. |
| 2017/0248799 | A1 | 8/2017 | Streets et al. |
| 2017/0248801 | A1 | 8/2017 | Ashwood |
| 2018/0074343 | A1 | 3/2018 | Ashwood |

FOREIGN PATENT DOCUMENTS

| | | |
|---|---|---|
| WO | WO-0135159 A1 | 5/2001 |
| WO | WO-2017151519 A1 | 9/2017 |

OTHER PUBLICATIONS

"U.S. Appl. No. 15/073,856, Notice of Allowance dated Aug. 25, 2017", 9 pgs.

"U.S. Appl. No. 15/073,856, Response filed May 22, 2017 to Non Final Office Action dated Mar. 9, 2017", 9 pgs.

"U.S. Appl. No. 15/084,683, Corrected Notice of Allowance dated Jun. 20, 2017", 4 pgs.

"U.S. Appl. No. 15/084,683, Non Final Office Action dated Dec. 1, 2016", 11 pgs.

"U.S. Appl. No. 15/084,683, Notice of Allowance dated Apr. 12, 2017", 7 pgs.

"U.S. Appl. No. 15/084,683, PTO Response to Rule 312 Communication dated Jun. 30, 2017", 2 pgs.

"U.S. Appl. No. 15/084,683, Response filed Feb. 28, 2017 to Non Final Office Action dated Dec. 1, 2016", 10 pgs.

"U.S. Appl. No. 15/086,233, Non Final Office Action dated Dec. 21, 2016", 12 pgs.

"U.S. Appl. No. 15/086,233, Notice of Allowance dated Apr. 24, 2017", 7 pgs.

"U.S. Appl. No. 15/086,233, Response filed Mar. 16, 2017 to Non Final Office Action dated Dec. 21, 2016", 9 pgs.

"International Application Serial No. PCT/US2017/019740; International Search Report dated Jun. 2, 2017", 5 pgs.

"International Application Serial No. PCT/US2017/019740, Written Opinion dated Jun. 2, 2017", 9 pgs.

Leyden, John, "This SMS will self-destruct in 40 seconds", [Online]. Retrieved from the Internet: <URL: http://www.theregister.co.uk/2005/12/12/stealthtext/, (Dec. 12, 2005), 1 pg.

Lin, Jun, "Eyewear with conductive Temple Joint", U.S. Appl. No. 14/869,149, filed Sep. 29, 2015, (Sep. 29, 2015), 33 pgs.

"International Application Serial No. PCT US2017 019740, International Preliminary Report on Patentability dated Sep. 13, 2018", 11 pgs.

"U.S. Appl. No. 15/818,458, Non Final Office Action dated Nov. 29, 2018", 10 pgs.

"U.S. Appl. No. 15/818,458, Response filed Feb. 8, 2019 to Non Final Office Action dated Nov. 29, 2018", 13 pgs.

WEARABLE ELECTRONIC DEVICE WITH ARTICULATED JOINT

CLAIM OF PRIORITY

This application is a continuation and claims the benefit of priority to U.S. application Ser. No. 15/086,233, filed Mar. 31, 2016, which claims the benefit of priority of U.S. Provisional Application Ser. No. 62/301,061, filed Feb. 29, 2016, which are hereby incorporated by reference in their entirety.

TECHNICAL FIELD

The subject matter disclosed herein generally relates to heat management in wearable electronic devices.

BACKGROUND

Many devices, including wearable devices, utilize electronics to perform various functions. Heat management for such electronics, to keep the electronics within a heat range corresponding to acceptable performance, can be problematic owing for example to space and weight constraints of a wearable device of which the electronics form part, as well as by the fact that some such devices can be worn in contact with the user's body.

BRIEF DESCRIPTION OF THE DRAWINGS

The present disclosure is illustrated by way of example, and not by way of limitation, in the figures of the accompanying drawings, in which.

OVERVIEW

A brief overview of some aspects of the disclosure with reference to selected drawings follows, after which various features of the disclosed subject matter will be described in greater detail.

Figure 1:
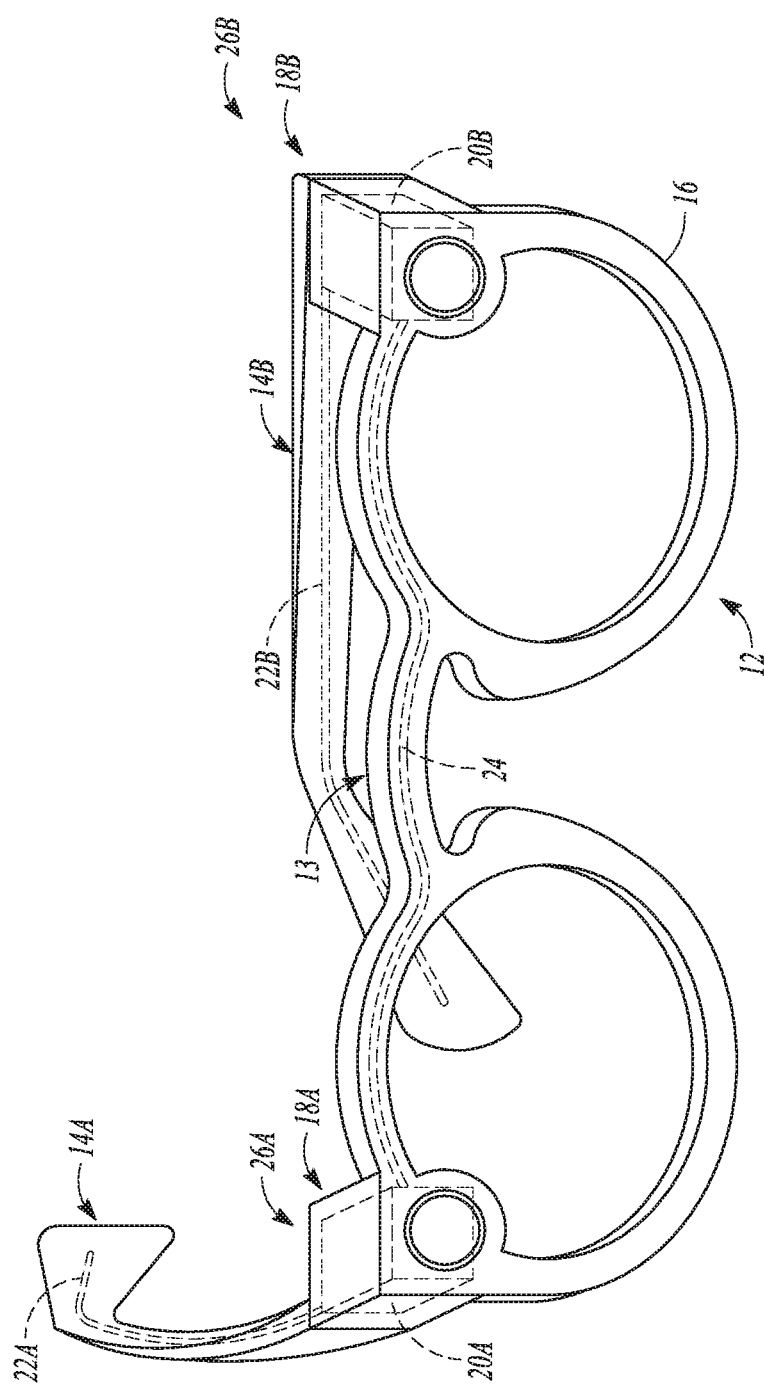
FIG. 1 is a perspective view of eyewear comprising a wearable electronic device including temples, a frame, onboard electronic components and core wires according to one embodiment.
Figure 2:
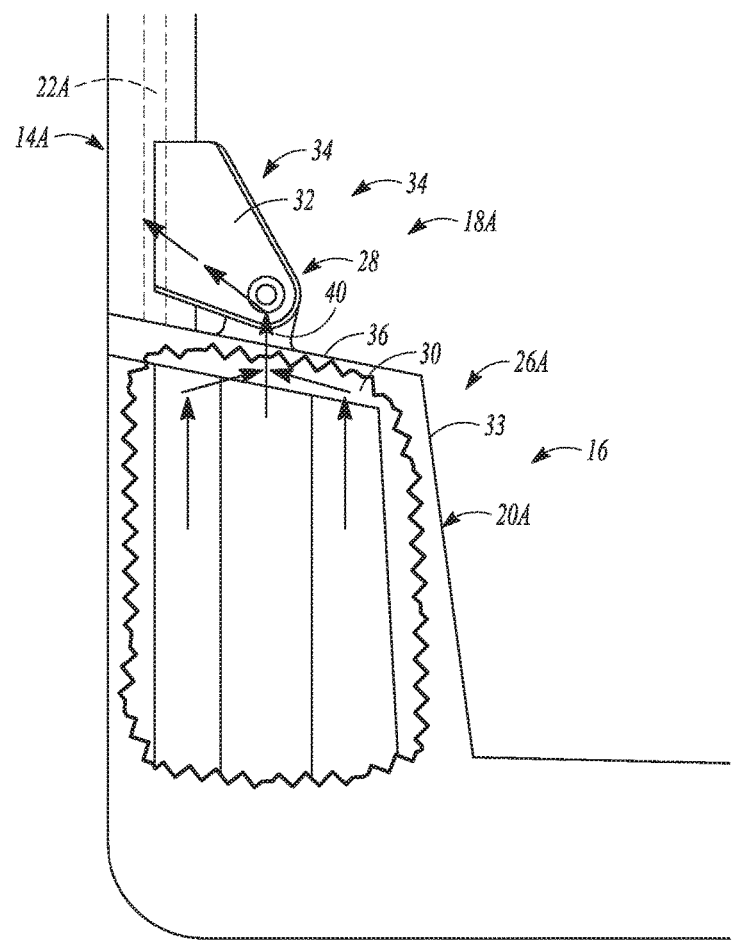
FIG. 2 is a plan view of a portion of the frame housing the electronics and further illustrating a heat conduction pathway from the frame through the hinge to the temple, according to one embodiment.

One aspect of this disclosure relates to a wearable device such as an eyewear article with onboard electronic components such as a camera, a processor, WiFi, and various modules as is shown in FIGS. 1 to 4. As such, the eyewear article comprises smart glasses. The onboard electronic components can be carried by a body of the smart glasses, such as in the frame as illustrated in FIGS. 1 to 2, or in the temple(s). The onboard electronic components can generate relatively large amounts of heat during electrically powered operation, given volume constraints for the smart glasses. For smart glasses, it is generally desirable for the onboard electronics components to be carried (e.g., housed) in a manner that does not make the smart glasses unsightly or ungainly for the user. Although these criteria may be satisfied by making the onboard electronic components and/or the housing for those components smaller, such reduction in size/volume and corresponding reduction in surface area can pose heat management problems. Inadequate heat transfer away from the electronics can eventually lead to failure or mal-performance of the onboard electronics components and/or can lead to undesirable external surface heating of the smart glasses. Such external surface heating can have undesired effects, e.g., by causing discomfort to the user or by creating a perception on the part of the user that the onboard electronics components are being overworked due to the user's activities.

In view of the foregoing, the current inventor proposes, among other solutions, utilizing a core wire, which typically acts to provide structural integrity to the smart glasses and also allows for adjustability of the temples to make the frames fit different face shapes, to additionally act as a heat sink to transfer heat generated by the onboard electronic components away therefrom (and away from the face of the user), so as to reduce the likelihood of localized heating adjacent the onboard electronic components and heating adjacent the user's face. Furthermore, the inventor proposes a configuration for the smart glasses that can provide for a thermal coupling between different components of the smart glasses (e.g., between the temple and the frame). More particularly, the thermal coupling can extend across an articulated joint (e.g., a hinge assembly) between the temple and the frame to provide part of a heat conduction path from onboard electronic components in the frame to the core wire, as shown in the example embodiment of FIGS. 2 and 3.

Figure 3:
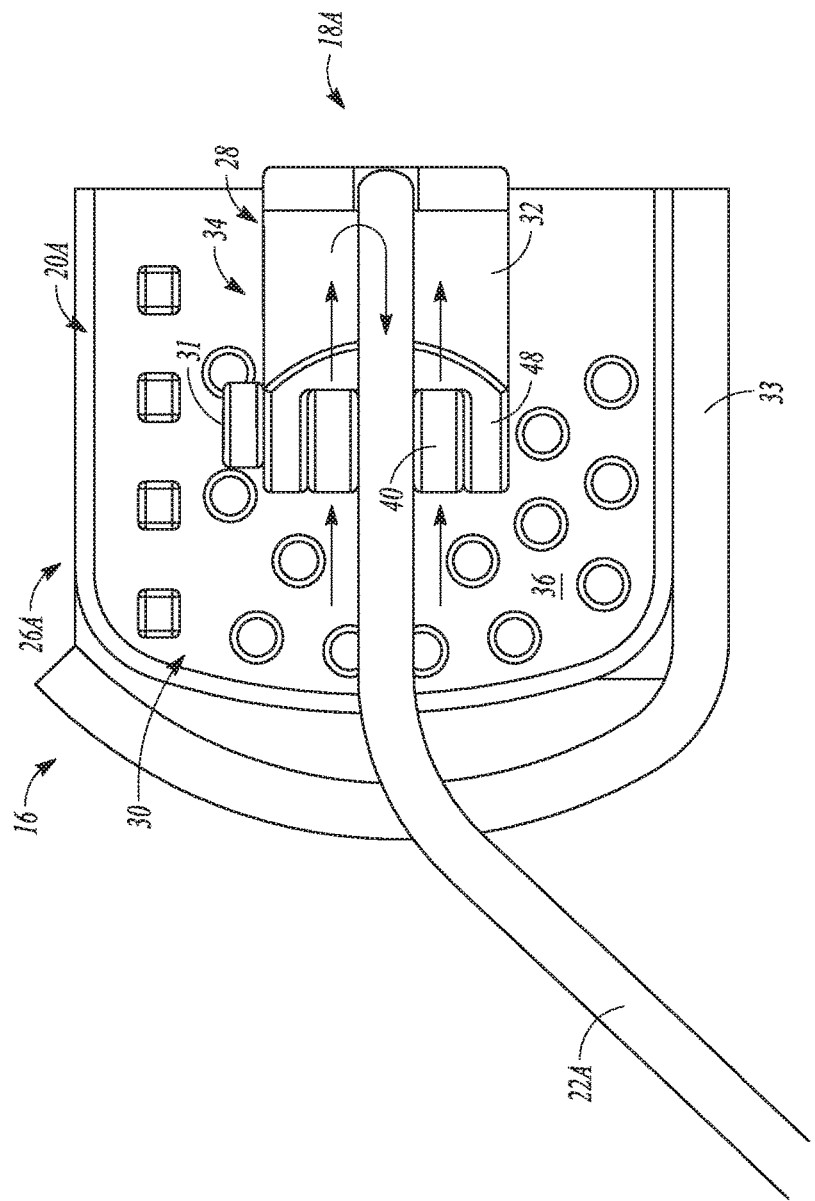
FIG. 3 is plan view of a rear portion of the frame and additionally showing the hinge assembly and core wire according to one embodiment.
Figure 4:
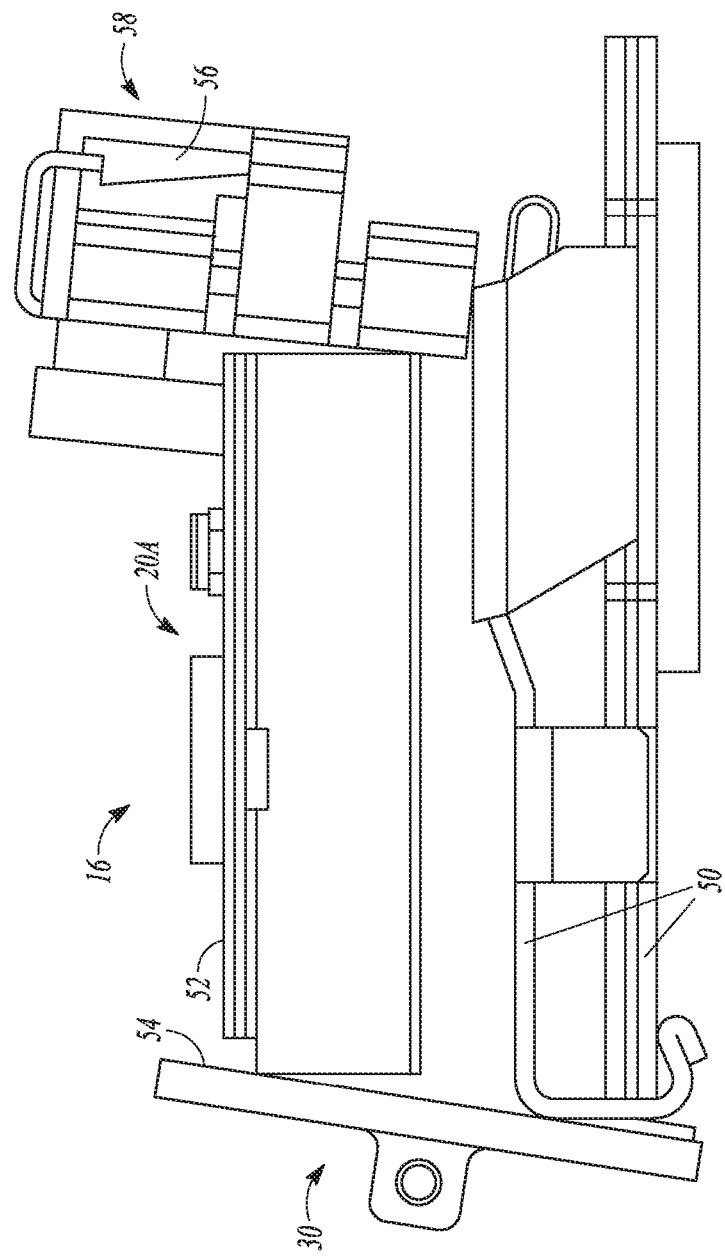
FIG. 4 is a plan view of the onboard electronic components, a thermal coupling and a hinge assembly with portions of the frame and temples removed according to one embodiment.

Further, the inventor proposes a cap hinge that can be part of the housing of the frame as well as being part of the hinge assembly (e.g., FIGS. 2-4). As shown in FIG. 4, the cap hinge can be abutted along one or more internal surfaces disposed within the frame in a conductive heat exchange relationship by one or more heat sinks internal to the frame. These internal heat sinks can carry the onboard electronics components thereon. Thus, according an example, a conductive heat transfer pathway can be formed from the internal heat sinks to the cap hinge and from the cap hinge across the hinge assembly to the core wire as shown in FIGS. 2 and 3.

In some examples, the onboard electronic components may be carried by the frame alone. In other embodiments, the electronic components may be carried by on or more of the temples. In yet further embodiments, the electronic components may be carried by both the frame and at least one of the temples. Similarly, the core wire can be part of the temple(s) and/or part of the frame (e.g., FIGS. 1 and 1A). Thus, in some embodiments, the onboard electronic components can be disposed on both the left and right side portions of the frame, and each temple can contain a respective core wire that is thermally coupled to corresponding onboard electronic components.

In some embodiments, the smart glasses can be operable (i.e. are electrically powered) even in a collapsed condition where one or more of the temples are folded towards the frame to a non-wearable position for the user. In such a collapsed condition, as well as in a wearable condition where one or both of the temples are extended so as to be received around a user's face, the onboard electronic components can run software and perform other tasks that can improve the glasses' efficiency and performance. The thermal coupling between the temple and the frame can be configured to conduct heat across the articulated joint both when the temple(s) is in the wearable condition and when the temple is in the collapsed condition.

Figure 5:
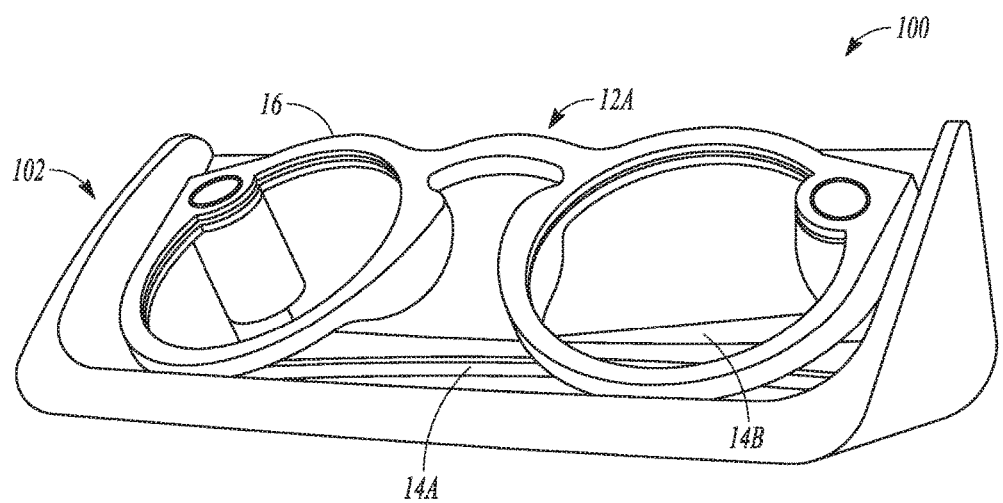
FIG. 5 is a perspective view of the eyewear disposed in a case according to one embodiment.

In the collapsed condition, the smart glasses can be placed in a case or carrier (e.g., FIG. 5). In some examples, the case can have a port (e.g., FIG. 5A) for data and/or power transfer to a mating port on the smart glasses. Thus, the case can be used for recharging of a battery of the smart glasses, for example. In such examples, the thermal coupling between the temple and the frame can be configured to conduct heat to the core wire. Such heat can result from the charging of the battery and/or from powered operation of the onboard electronic components when the temple is in the collapsed condition within the case.

DETAILED DESCRIPTION

The description that follows includes apparatuses, systems, and techniques that embody illustrative embodiments of the disclosure. In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known structures and techniques are not necessarily shown in detail. Certain embodiments described in detail herein may be referred to as examples.

Embodiments described herein relate to apparatuses, systems and techniques that allow smart glasses to that can conduct heat away from onboard electronic components (and the face of the user) in a more desirable manner. This can make the smart glasses as more reliable and wearable.

This disclosure applies to smart glasses (e.g., those that have electronics carried thereby). Smart glasses include onboard electronic components such as a power source, power and communication related circuitry, communication devices (e.g., a camera, a microphone, sensors, etc.), display devices, a computer, a memory, modules, and/or the like.

Regarding the construction of the smart glasses itself, according to one example, the smart glasses comprise an eyewear body configured for wearing by a user to hold one or more optical elements mounted on the eyewear body within a field of view of the user. Such optical elements can include not just lenses (as is the case in the embodiments described below), but can in other embodiments include any object that can be held close to the eye and through which or from which light is passed to the eye. As such, the term optical elements includes displays (such as virtual reality displays, augmented reality displays, or other near-eye displays), surfaces such as those of a smartphone or tablet, and lenses, both corrective and non-corrective, for example.

The smart glasses can include the frame and a pair of the temples coupled thereto on opposite ends of the frame at articulated joints. For any one of the temples, the temple is in the wearable configuration or condition when the temple is substantially fully unfolded for reception along a side of the user's head. In contrast, a temple is in the collapsed configuration or condition when that temple is hingedly folded towards the frame. Thus, the smart glasses can be in both the wearable configuration and the collapsed configuration at the same time (e.g., one temple unfolded the other temple folded towards the frame) and the onboard electronics components can be electrically powered so as to be operable in either condition, as previously discussed.

FIG. 1 shows a perspective view of a front of a pair of smart glasses 12. The smart glasses 12 can comprise an eyewear body 13. The eyewear body 13 can include one or more temples 14A and 14B and a frame 16. The smart glasses 12 can additionally include articulated joints 18A and 18B, onboard electronic components 20A and 20B, and core wires 22A. 22B and 24.

The eyewear body 13 can be configured for wearing by a user to hold one or more optical elements mounted on the eyewear body 13 within a field of view of a user. More particularly, the frame 16 can be configured to hold the one or more optical elements, while the temples 14A and 14B can be connected to the frame 16 at the respective articulated joints 18A and 18B. The temples 14A and 14B can comprise elongate members having core wires 22A and 22B extending therein.

The temple 14A is illustrated in the wearable condition while the temple 14B is illustrated in the collapsed condition in FIG. 1. As shown in FIG. 1, the temple 14A can be connected to a right end portion 26A of the frame 16 by the articulated joint 18A. Similarly, the temple 14B can be connected to a left end portion 26B of the frame 16 by the articulated joint 18B. The right end portion 26A of the frame 16 can carry the onboard electronic components 20A by housing the onboard electronic components 20A therein, and the left end portion 26B can carry the onboard electronic components 20B by housing the onboard electronic components 20B therein.

The core wire 22A can comprise a portion of the temple 14A (e.g., can be embedded within a plastics material or other material that comprises an outer cap of the temple 14A) and can extend longitudinally from adjacent the articulated joint 18A toward a second longitudinal end of the temple 14A. Similarly, the core wire 22B can comprise a portion of the temple 14B (e.g., can be embedded within a plastics material or other material that comprises an outer cap of the temple 14B) and can extend longitudinally from adjacent the articulated joint 18B toward a second longitudinal end of the temple 14B. The core wire 24 can extend from the right end portion (terminating adjacent the onboard electronic components 20A) to the left end portion 26B (terminating adjacent the onboard electronic components 20B).

The onboard electronic components 20A and 20B can be carried by the eyewear body 13 (e.g., either or both of the temple(s) 14A. 14B and/or the frame 16). The onboard electronic components 20A and 20B can comprise a heat source that generates heat during electrically powered operation. As previously discussed, the onboard electronic components 20A and 20B can comprise a power source, power and communication related circuitry, communication devices (e.g., a camera, a microphone, sensors, etc.), display devices, a computer, a memory, modules, and/or the like.

The temples 14A, 14B and the frame 16 can be constructed of a plastics material, cellulosic plastic (e.g., cellulosic acetate), an eco-plastic material, a thermoplastic material, or the like in addition to the core wires 22A. 22B and 24. The core wires 22A, 22B and 24 can act to provide structural integrity to the eyewear body 13 (i.e. the temple(s) 14A, 14B and/or the frame 16). Additionally, the core wires 22A. 22B and/or 24 can act as a heat sink to transfer the heat generated by the onboard electronic components 20A and 20B away therefrom so as to reduce the likelihood of localized heating adjacent the onboard electronic components 20A and 20B. As such, the core wires 22A, 22B and/or 24 can be thermally coupled to the heat source to provide a heat sink for the heat source. The core wires 22A, 22B and/or 24 can be constructed of a relatively flexible conductive metal or metal alloy material such as one or more of an aluminum, an alloy of aluminum, alloys of nickel-silver, and a stainless steel for example.

Figure 1A:
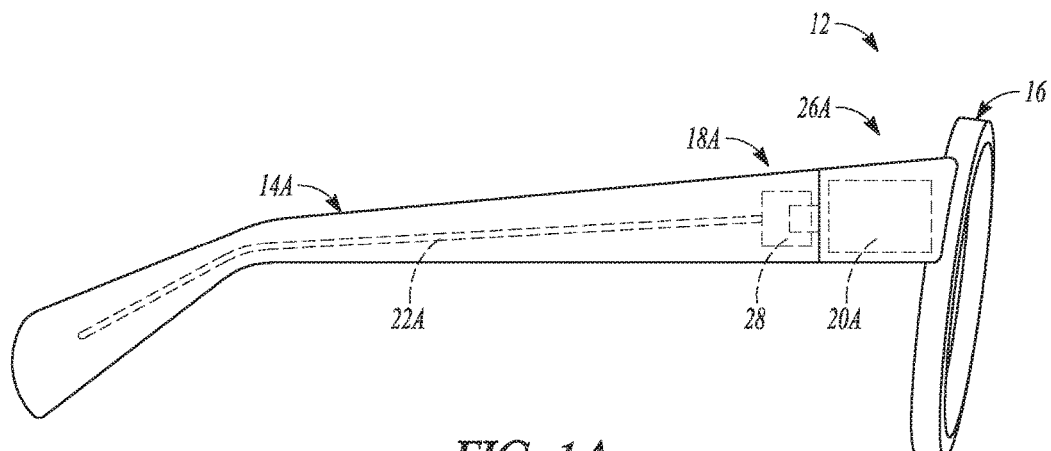
FIG. 1A shows a plan view of the eyewear from FIG. 1 from a side thereof and illustrating the onboard electronic components housed in the frame and one of the core wires extending along one of the temples according to one embodiment.

FIG. 1A shows a side view of the smart glasses 12 illustrating the temple 14A, the right end portion 26A of the frame 16, the articulated joint 18A, the onboard electronic components 20A and the core wire 22A.

Temple 14A and core wire 22A extend generally longitudinally rearward from a rear facing surface of the right end portion 26A of the frame 16. According to the illustrated example of FIG. 1A, the articulated joint 18A (shown in dashed) comprises a hinge assembly 28 that includes hinge projections configured to mate with one another as illustrated and discussed subsequently. According to other embodiments, the articulated joint 18A can comprise a linkage assembly, a ball joint assembly, a male/female assembly, or another type of mechanical connection that allows for movement of the temple 14A relative to the frame 16.

As will be illustrated subsequently, the articulated joint 18A can also be formed as part of the frame 16 and the temple 14A. Indeed, the articulated joint 18A can be configured to provide for movement of the temple 14A relative to the frame 16. Thus, the articulated joint 18A allows for movement of the temple 14A such that it is disposable between the collapsed condition and the wearable configuration as illustrated in FIG. 1.

FIG. 2 shows an enlarged view of the right end portion 26A of the frame 16, the articulated joint 18A, the onboard electronic components 20A, the temple 14A and the core wire 22A. FIG. 2 also illustrates components of the hinge assembly 28 including a cap hinge 30 and a temple hinge 32.

As shown in the example of FIG. 2, the onboard electronic components 20A are located within the frame 16. Thus, the heat source is located within the frame 16. In particular, the onboard electronic components 20A can be housed within a cavity in the right end portion 26A of the frame 16. According to one example, this cavity can encompass a small volume (e.g., the cavity can be is ~17 mm long). Thus, in order to dissipate the heat more evenly and effectively, the core wire 22A can be used as the heat sink to pull heat away from the onboard electronic components 20A and a housing 33 that forms and encases the cavity and the onboard electronic components 20A.

Together, components of the hinge assembly 28 can form a thermal coupling 34. The thermal coupling 34 can comprise at least a second heat sink (after the core wire 22A) for the heat source. The thermal coupling 34 can extend between the heat source and the core wire 22A across the articulated joint 16A between the temple 14A and the frame 16. As the thermal coupling 34 can be comprised of components of the hinge assembly 28, the thermal coupling 34 can be configured to conduct heat across the articulated joint 18A both when the temple 14A is in the wearable condition and when the temple is in the collapsed condition.

The cap hinge 30 can form a portion of the thermal coupling 34 and can additionally form a portion of the frame 16 and the hinge assembly 28. More particularly, the cap hinge 30 can have a first portion 36 integrally formed with the housing 33 of the frame 16 and has a second portion 40 comprising a projection extending from the frame 16 and the first portion 36. As will be further illustrated subsequently in reference to FIG. 4, the cap hinge 30 can be abutted along one or more internal surfaces disposed within the frame 16 in a conductive heat exchange relationship by one or more heat sinks internal to the frame 16.

The temple hinge 32 can form a portion of the thermal coupling 34 and can additionally form a portion of the temple 14A and the hinge assembly 28. The temple hinge 32 can comprise a third heat sink (in addition to at least the core wire 22A and the cap hinge 30). The temple hinge 32 can be coupled to the core wire 22A in a conductive heat exchange relationship. More particularly, according to one example the core wire 22A can be soldered or otherwise connected to the temple hinge 32 in a solid heat conductive manner. The temple hinge 30 can be connected to the cap hinge 32 via a metal screw or fastener (shown in FIG. 3).

FIG. 2 illustrates a conductive heat transfer pathway (illustrated by arrows) where heat generated by electrical powered operation of the onboard electronic components 20A is conducted away therefrom (and away from the face of the user) via one or more heat sinks internal to the frame 16. The heat is conducted along the pathway to the cap hinge 30, through the screw (see FIG. 3), and the temple hinge 32 to the core wire 22A within the temple 14A. Thus, the thermal coupling 34 can be configured such that the heat from the onboard electronic components 20A can be conducted to the cap hinge 30, through the screw and temple hinge 32 to the core wire 22A within the temple 14A.

FIG. 3 shows an enlarged view of the right end portion 26A of the frame 16, the articulated joint 18A, the onboard electronic components 20A, the temple 14A, the core wire 22A, the hinge assembly 28 and the thermal coupling 34 from a rear position. The encasing portion of the temple 14A is removed in FIG. 3 to better illustrate the cap hinge 30, the screw 31, the temple hinge 32 and the core wire 22A. Portions of the housing 33 are also removed to better illustrate the cap hinge 30.

FIG. 3 shows the cap hinge 30 in further detail. For example, the first portion 36 can have a relatively large surface area comprised of opposing relatively flat surfaces that can take up most of the rear-facing portion of the right end portion 26A of the frame 16. Such relatively large surface area provides a sufficient area for heat transfer purposes. The first portion 36 can include apertures 41 therein. These apertures 41 can be used for convection heating of the onboard electronic components 20A in some embodiments. In other cases, the apertures 41 can be used to facilitate electrical communication via wire therethrough and/or can simply be used to reduce the weight of the cap hinge 30. The second portion 40 of the cap hinge 30 comprising projections are configured to be received in corresponding projections 48 of the temple hinge 32. The second portion 40 and the projections 48 can be configured to receive the screw 31 therein.

FIG. 3 illustrates the conductive heat transfer pathway (previously discussed and illustrated in reference to FIG. 2) where heat generated by electrical powered operation of the onboard electronic components 20A is conducted away therefrom (and away from the face of the user) via one or more heat sinks internal to the frame 16. The heat is conducted along the pathway (indicated by arrows) to the cap hinge 30, through the screw 31, and the temple hinge 32 to the core wire 22A within the temple 14A. Thus, the thermal coupling 34 can be configured such that the heat from the onboard electronic components 20A can be conducted to the cap hinge 30, through the screw 31 and temple hinge 32 to the core wire 22A within the temple 14A.

FIGS. 3 and 4 show the cap hinge 30 according to one example embodiment. The cap hinge 30 can include a first portion 36 also referred to as a hinge foot or base foot herein. The first portion 36 can be configured to be flush with the housing 33 according to some embodiments. Thus, the thickness $L_1$ (FIG. 4) of the first portion 36 can be substantially the same as the housing 33 according to one embodiment. According to one embodiment, the thickness $L_1$ (FIG. 4) can be less than about 1 mm and can be between 0.5 mm and 1.0 mm in some embodiments. The thickness of the first portion 36 can be up to 22 times smaller than a longitudinal thickness measured along the same axis of the cavity which houses the electronic components and the heat sinks therein. The first portion 36 can be co-molded (inset molded) with the housing 33 to maintain structural load transfer between the temple and the frame 16. Thus, a plastic that can form the housing 33 can be molded over the hinge cap 32 including the first portion 36 rather than the hinge being assembled within the frame 16 in a manner of traditional glasses.

Furthermore, the first portion 36 can be provided with various features including the apertures 41 and tab features 43, which can facilitate load transfer between the housing 33 and the first portion 36. For example, the aperture 41 allow an amount of molded material that forms the housing 33 to flow therein to facilitate fixation and load transfer between the housing 33 and the first portion 36. Additionally, as shown in FIG. 3, the first portion 36 can be provided with a width $W_1$ and a height $H_1$ that are relatively large compared to that of the thickness $L_1$. In some embodiments, the width $W_1$ and the height $H_1$ can each be up to 10 times larger than the thickness $L_1$. The relatively larger width $W_1$ and the height $H_1$ provide the first portion 36 with a relatively large surface area (e.g., about 144 mm$^2$) for fixation to the housing 33 and to other components of the smart glasses 12.

Thus, the embodiment of the cap hinge 30 can have a relatively smaller longitudinal dimension relative to other dimensions such as a width $W_1$ and the height $H_1$. The cap hinge 30 can include a hinge foot portion that is configured to be co-molded to a housing of the smart glasses. The co-molding can facilitate that the hinge foot portion be arranged flush with the housing 33 with an exposed inward facing surface that is configured to be abutted by electronics and/or heat sink components. The cap hinge 30 can include fixation features to facilitate structural load transfer between a temple and a frame. These features can include apertures 41 configured to receive the housing 33 therein. The features can also include tab projections extending from an edge of the hinge foot and abutting the housing 33. According to some embodiments, the hinge foot portion can take up significantly the entirety of a longitudinal end portion of a connection area between the temple and the frame.

Thus, according to one embodiment, a wearable device is disclosed comprising the frame 16, the elongate temple 14A and the articulated joint 18A. The frame 16 can define one or more optical element holders configured to hold respective optical elements for viewing by a user in a viewing direction. The temple 14A can be moveably connected to the frame for holding the frame in position when the device is worn by the user. The articulated joint 18A can connect the temple and the frame to permit movement of the temple relative to the frame between a wearable position in which the temple is generally aligned with the viewing direction, and a collapsed position in which the temple extends generally transversely to the viewing direction. The articulated joint can include the base foot 36 fixed to the frame and oriented transversely to the viewing direction.

The wearable device can further include the onboard electronic components 20A that can be housed by at least one of the temple 14A and the frame 16. The onboard electronic components 20A can be housed in the frame in the first end portion 26A located at a lateral end of the frame. The first end portion 26A can project rearward relative to the one or more optical element holders and can comprise the housing 33 that defines a cavity configured to receive the onboard electronic components therein. According to some embodiments, the base foot 36 of the articulated joint comprises a rear end face of the housing 33 and comprises the rear end face that interfaces with the temple 14A.

According to one embodiment, the articulated joint 18A can comprise a hinge assembly 28 and the base foot 36 can form part of the cap hinge 30, which additionally extends rearward from the housing and can be configured to couple with a hinge component of the temple. The base foot 36 can form both a portion of the frame 16 and a part of the hinge assembly 28. The base foot 36 can form a portion of the housing 33 of the frame 16 that can be integrated into the housing 33. The base foot 36 can be abutted along one or more internal surfaces 54 disposed within the frame 16 in a conductive heat exchange relationship by one or more heat sinks 50 and 52 internal to the frame 16.

The base foot 36 can be configured to form substantially an entirety of the rear end face of the housing 33. The base foot 36 can be configured to be flush with a surface of the housing and can have a longitudinal thickness ($L_1$) substantially similar to a longitudinal thickness of the housing. According to one embodiment, the longitudinal thickness ($L_1$) of the base foot is between 0.5 mm and 1.0 mm. According to further embodiments, the base foot 36 can have a width ($W_1$) and a height ($H_1$) that are each are up to 10 times larger than the longitudinal thickness ($L_1$).

The base foot 36 can be configured to be embedded into the housing 33 and can be configured to have the housing 33 extend into and around at least a portion of the base foot (e.g., apertures 41). The base foot 36 can include one or more features that can be configured to facilitate a connection and a load transfer between the housing and the base foot (e.g., apertures 41 and/or tab features 43). Thus, according to one embodiment the one or more features can include the aperture 41 configured to receive a part of the housing 33 therein.

According to another embodiment, a pair of smart glasses 12 is disclosed which can include the frame 16, the elongate temple 14A, the onboard electronics components 20A, and the hinge assembly 28. The frame 16 can define one or more optical element holders configured to hold respective optical elements for viewing by a user in a viewing direction. The temple 14A can be moveably connected to the frame for holding the frame in position when the device is worn by the user. The onboard electronic components 20A that can be housed by at least one of the temple 14A and the frame 16. The onboard electronic components 20A can be housed in the frame in the first end portion 26A located at a lateral end of the frame. The first end portion 26A can project rearward relative to the one or more optical element holders and can comprise the housing 33 that defines a cavity configured to receive the onboard electronic components therein. According to some embodiments, the hinge assembly 28 can connect the temple 14A to the frame. The hinge assembly 28 can have the base foot 36 that forms substantially an entirety of a rear end face of the housing that interfaces with the temple 14A. The base foot 36 can be configured to be flush with a surface of the housing 33 and can be configured to be embedded into the housing 33. The base foot 36 can be configured to facilitate a connection and load transfer between the housing 33 and the base foot 36.

According to yet another embodiment, a pair of smart glasses 12 is disclosed which can include the frame 16, the elongate temple 14A, the onboard electronics components 20A, and the hinge assembly 28. The frame 16 can define one or more optical element holders configured to hold respective optical elements for viewing by a user in a viewing direction. The temple 14A can be moveably connected to the frame for holding the frame in position when the device is worn by the user. The onboard electronic components 20A that can be housed by at least one of the temple 14A and the frame 16. The onboard electronic components 20A can be housed in the frame in the first end portion 26A located at a lateral end of the frame. The first end portion 26A can project rearward relative to the one or more optical element holders and can comprise the housing 33 that defines a cavity configured to receive the onboard electronic components therein. According to some embodiments, the hinge assembly 28 can connect the temple 14A to the frame. The hinge assembly 28 can have the base foot 36 that is a portion of the housing 33 of the frame 16 and can be integrated into the housing 33. The base foot 36 can be configured to facilitate a connection and load transfer between the housing 33 and the base foot 36. The base foot 36 can be configured to form substantially an entirety of a temple interfacing part of the housing 33. The base foot 36 has a width ($W_1$) and a height ($H_1$) that are each are up to 10 times larger than a longitudinal thickness ($L_1$) thereof.

FIG. 4 shows portions of the frame 16 with portions of the housing 33 (FIG. 2) and components of the temple 14 (FIG. 2) removed. In particular, FIG. 4 shows the onboard electronic components 20A, a first internal heat sink 50, a second internal heat sink 52, and the cap hinge 30 arranged together.

The cap hinge 30 can be abutted along one or more internal surfaces 54 disposed within the frame 16 in a conductive heat exchange relationship by the first internal heat sink 50 and the second internal heat sink 52. The first internal heat sink 50 and the second internal heat sink 52 can be entirely internal to the frame 16 (i.e. can be disposed within the housing 33 of FIG. 2). Similarly, the onboard electronic components 20A can disposed entirely within the frame 16 (i.e. can be disposed within the housing 33 of FIG. 2) and can carried by the first internal heat sink 50 and the second internal heat sink 52.

The first internal heat sink 50 can be spaced from the second internal heat sink 52. According to the example of FIG. 4, the first internal heat sink 50 can extend generally longitudinally and can extend generally parallel with the second internal heat sink 52. The first internal heat sink 50 can be configured to hold and to wrap around various boards and/or modules that comprise some of the onboard electronic components 20A. Similarly, the second internal heat sink 52 can be configured to hold and sandwich various boards and/or modules that comprise some of the onboard electronic components 20A. In the example of FIG. 4, the second internal heat sink 52 can extend longitudinally from the cap hinge 30 to abut an image sensor 56 of a camera 58. As discussed previously, the first internal heat sink 50 and the second internal heat sink 52 can act to conduct heat away from the onboard electronic components 20A to the cap hinge 30 and onward to the core wire 22A (FIGS. 1-2).

According to one example, the one or more internal surfaces 54 of the cap hinge 30 can have a thermal interface material (TIMs) disposed thereon. The TIM can help to provide good thermal contact between the cap hinge 30 and the first internal heat sink 50 and the second internal heat sink 52. The first internal heat sink 50 and the second internal heat sink 52 can additionally utilize TIMs to provide for good thermal contact between the first internal heat sink 50 and the second internal heat sink 52 and the onboard electronic components 20A (e.g., the processor, the WiFi module, the memory, and the image sensor 56). All of these contacts via TIMs allow for heat to be moved rearward through the first internal heat sink 50 and the second internal heat sink 52 to the cap hinge 30 and on to the core wire 22A (FIGS. 1-2).

Figure 5A:
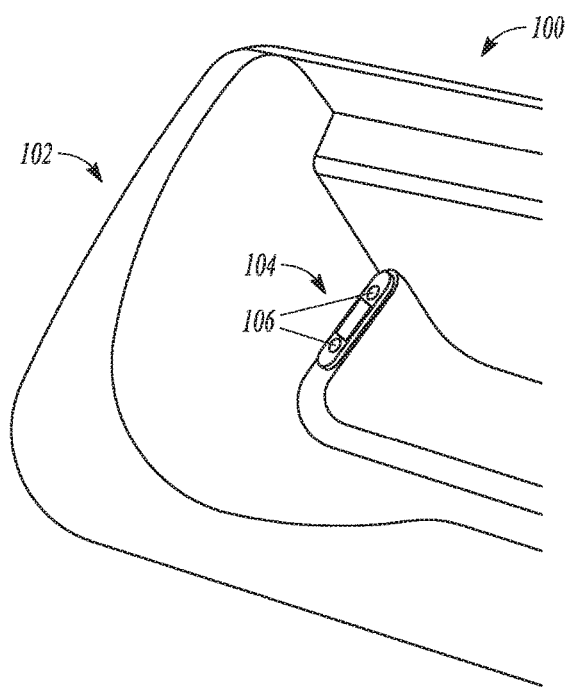
FIG. 5A is a perspective view of an interior portion of the case of FIG. 5 with the eyewear removed to show an electronics connector according to one embodiment.

According to a further example, the smart glasses 12 previously described can be used as part of a system such as system 100. The system 100 can include a case 102 and the smart glasses 12 as illustrated in FIGS. 5 and 5A. In some cases, a cable (not shown) can also be utilized with the system 100. As discussed with regard to previous embodiments, the smart glasses 12 can generally include the frame 16, one or more temples 14A and 14B, and on board electronic components (as illustrated and discussed in previous embodiments); the details of each will not be discussed in great detail as aspects of these items have been previously described.

The case 102 can comprise a container or holder for the glasses 12. In some embodiments such as that of FIG. 5A, the case 102 and glasses 12 can include complementary electronic connectors 104. One such electronic connectors 104 can comprise a base or internal connector or port 106 on the case 102 and a corresponding connector (not shown) on the smart glasses 12.

Further details regarding such electronic connectors 104 and discussion of the systems and apparatuses related thereto can be found the Applicant's co-pending U.S. application Ser. No. 14/687,362, entitled "EYEWEAR HAVING LINKAGE ASSEMBLY BETWEEN A TEMPLE AND A FRAME" filed Apr. 15, 2015, co-pending U.S. application Ser. No. 14/687,308, entitled "EYEWEAR HAVING SELECTIVELY EXPOSABLE FEATURE" filed Apr. 15, 2015, and co-pending U.S. application Ser. No. 14/869,149, entitled "EYEWEAR WITH CONDUCTIVE TEMPLE JOINT" filed Sep. 29, 2015; the contents of each of which are hereby incorporated by reference in their entirety.

In the collapsed condition, the smart glasses 12 can be placed in the case 102. The smart glasses 12 can be operable (i.e. are electrically powered) even in the collapsed condition. In such collapsed condition, as well as in the wearable condition where one or both of the temples 14A and 14B are extended so as to be received around a user's face, the onboard electronic components can run software and perform other tasks that can improve the glasses' efficiency and performance thereby improving the user experience. The thermal coupling between the temple 14A. 14B and the frame 16 can be configured to conduct heat across the articulated joint both when the temple(s) 14A. 14B is in the wearable condition (previously shown in FIGS. 1 and 1A) and when the temples 14A and 14B are in the collapsed condition such as shown in FIG. 5.

As illustrated in FIGS. 5 and 5A, the smart glasses 12 and the case 102 can interact together in various ways and for various purposes. For example, the case 102 can be used to transport and protect the smart glasses 12, to charge or provide power to the electronics incorporated in the smart glasses 12, and/or to communicate with the electronics of the smart glasses 12. Thus, in some embodiments the case 102 can house a supplemental battery to those of the smart glasses 12. The thermal coupling 34 (FIGS. 2 and 3) between the temples 14A, 14B and the frame 16 can be configured to conduct heat to the core wire with the temples 14A, 14B in any position relative to the frame 16. Such heat can result from the charging of the battery or from powered operation of the onboard electronic components when the temples 14A. 14B are in the collapsed condition within the case 102.

The internal connector of the case 102 can be configured to couple to a corresponding electronic connector of the glasses 12 in a manner previously described in Applicant's previously cited co-pending U.S. Patent Applications when the temples 14A and 14B are in the collapsed position and docked in the case 102. As such, the interior of the case 102 can be shaped to receive the smart glasses 12 only when the temples 14A and 14B are in the collapsed condition. The shape of the interior also can be such that the electronic connectors 104 (FIG. 5A) of those of the case 102 and of the glasses 12 interface together and are docked with little slippage or movement occurring between the case 102 and the glasses 12. Although illustrated as pogo pin/pad connectors in FIG. 5A, the connectors can be of virtually any type known in the art for power and/or data communication such as micro-USB, or the like.

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A wearable device comprising:
    a frame defining one or more optical element holders configured to hold respective optical elements for viewing by a user in a viewing direction;
    an elongate temple moveably connected to the frame for holding the frame in position when the device is worn by the user; and
    an articulated joint connecting the temple and the frame to permit movement of the temple relative to the frame between a wearable position in which the temple is generally aligned with the viewing direction, and a collapsed position in which the temple extends generally transversely to the viewing direction, the articulated joint including a base foot fixed to the frame and oriented transversely to the viewing direction, wherein the base foot is additionally a portion of a housing of the frame that is integrated into the housing, wherein the base foot is abutted along one or more internal surfaces disposed within the frame in a conductive heat exchange relationship by one or more heat sinks internal to the frame.

2. The wearable device of claim 1, further comprising onboard electronic components housed by at least one of the temple and the frame.

3. The wearable to device of claim 2, wherein the onboard electronic components are housed in the frame in a first end portion located at a lateral end of the frame, the first end portion projecting rearward relative to the one or more optical element holders and comprising a housing that defines a cavity configured to receive the onboard electronic components therein.

4. The wearable device of claim 3, wherein the base foot of the articulated joint comprises a rear end face of the housing and comprises the rear end face that interfaces with the temple.

5. The wearable device of claim 3, wherein the articulated joint comprises a hinge assembly, the base foot forming part of a cap hinge which additionally extends rearward from the housing and is configured to couple with a hinge component of the temple.

6. The wearable device of claim 3, wherein the base foot is configured to form substantially an entirety of a rear end face of the housing.

7. The wearable device of claim 3, wherein the base foot is configured to be flush with a surface of the housing and has a longitudinal thickness substantially similar to a longitudinal thickness of the housing.

8. The wearable device of claim 7, wherein the longitudinal thickness of the base foot is between 0.5 mm and 1.0 mm.

9. The wearable device of claim 7, wherein the base foot has a width and a height that are each are up to 10 times larger than the longitudinal thickness.

10. The wearable device of claim 3, wherein the base foot is configured to be embedded into the housing and is configured to have the housing extend into and around at least a portion of the base foot.

11. The wearable device of claim 3, wherein the base foot includes one or more features that are configured to facilitate a connection and a load transfer between the housing and the base foot.

12. The wearable device of claim 11, wherein the one or more features include an aperture configured to receive a part of the housing therein.

13. The wearable device of claim 1, wherein the articulated joint comprises a hinge assembly including the base foot that forms both a portion of the frame and a part of the hinge assembly.

14. A pair of smart glasses, the smart glasses comprising:
- a frame defining one or more optical element holders configured to hold respective optical elements for viewing by a user in a viewing direction;
- an elongate temple moveably connected to the frame for holding the frame in position when the device is worn by the user;
- onboard electronic components housed in the frame in a first end portion located at a lateral end of the frame, the first end portion projecting rearward relative to the one or more optical element holders and comprising a housing that defines a cavity configured to receive the onboard electronic components therein; and
- a hinge assembly connecting the temple to the frame, the hinge assembly having a base foot that forms substantially an entirety of a rear end face of the housing that interfaces with the temple, wherein the base foot is configured to facilitate a connection and load transfer between the housing and the base foot.

15. The smart glasses of claim 14, wherein the base foot is configured to be flush with a surface of the housing and is configured to be embedded into the housing.

16. The smart glasses of claim 14, wherein the base foot has a width and a height that are each are up to 10 times larger than the longitudinal thickness.

17. The wearable device of claim 14, wherein the base foot is integrated into the housing, the base foot is abutted along one or more internal surfaces disposed within the frame in a conductive heat exchange relationship by one or more heat sinks internal to the frame.

18. A pair of smart glasses, the smart glasses comprising:
- a frame defining one or more optical element holders configured to hold respective optical elements for viewing by a user in a viewing direction;
- an elongate temple moveably connected to the frame for holding the frame in position when the device is worn by the user;
- onboard electronic components housed in the frame in a first end portion located at a lateral end of the frame, the first end portion projecting rearward relative to the one or more optical element holders and comprising a housing that defines a cavity configured to receive the onboard electronic components therein; and
- a hinge assembly connecting the temple to the frame, the hinge assembly having a base foot that is a portion of the housing of the frame and is integrated into the housing, the base foot includes one or more features to facilitate a connection and load transfer between the housing and the base foot, wherein the base foot is abutted along one or more internal surfaces disposed within the frame in a conductive heat exchange relationship by one or more heat sinks internal to the frame.

19. The smart glasses of claim 18, wherein the base foot is configured to form substantially an entirety of a temple interfacing part of the housing.

20. The smart glasses of claim 18, wherein the base foot has a width and a height that are each are up to 10 times larger than a longitudinal thickness thereof.

* * * * *

UNITED STATES PATENT AND TRADEMARK OFFICE
CERTIFICATE OF CORRECTION

PATENT NO. : 10,345,617 B1
APPLICATION NO. : 15/654441
DATED : July 9, 2019
INVENTOR(S) : Streets et al.

Page 1 of 1

It is certified that error appears in the above-identified patent and that said Letters Patent is hereby corrected as shown below:

On the Title Page

On page 2, in Column 2, under "Other Publications", Line 21, delete "PCT/US2017/019740;" and insert --PCT/US2017/019740,-- therefor In the Claims In Column 12, Line 39, in Claim 3, after "wearable", delete "to"

In Column 14, Line 4, in Claim 17, delete "wearable device" and insert --smart glasses-- therefor Signed and Sealed this
Eighth Day of December, 2020

Andrei Iancu
*Director of the United States Patent and Trademark Office*